United States Patent
Kim et al.

(10) Patent No.: US 10,680,593 B2
(45) Date of Patent: Jun. 9, 2020

(54) DELAY LOCKED LOOP CIRCUIT AND METHOD OF OPERATING A DELAY LOCKED LOOP CIRCUIT

(71) Applicant: Samsung Electronics Co., Ltd., Suwon-si, Gyeonggi-do (KR)

(72) Inventors: Sang-Kyeom Kim, Yongin-si (KR); Won-Joo Yun, Yongin-si (KR); SukYong Kang, Hwaseong-si (KR); Ho-Jun Chang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/204,520

(22) Filed: Nov. 29, 2018

(65) Prior Publication Data
US 2019/0181848 A1    Jun. 13, 2019

(30) Foreign Application Priority Data

Dec. 8, 2017   (KR) .......................... 10-2017-0168018

(51) Int. Cl.
| H03L 7/06 | (2006.01) |
| G06F 1/04 | (2006.01) |
| G11C 7/22 | (2006.01) |
| H03K 5/04 | (2006.01) |
| H03K 5/156 | (2006.01) |
| H03L 7/08 | (2006.01) |
| H03L 7/081 | (2006.01) |
| H03L 7/089 | (2006.01) |
| G11C 29/02 | (2006.01) |

(52) U.S. Cl.
CPC .......... *H03K 5/1565* (2013.01); *G11C 7/222* (2013.01); *G11C 29/023* (2013.01); *G11C 29/028* (2013.01); *H03L 7/0812* (2013.01); *H03L 7/0818* (2013.01); *H03L 7/0895* (2013.01)

(58) Field of Classification Search
CPC ..... G11C 7/222; G11C 29/023; G11C 29/028; H03L 7/0812; H03L 7/0818; H03L 7/0895; H03K 5/1565
USPC ......................................................... 365/194
See application file for complete search history.

(56) References Cited

U.S. PATENT DOCUMENTS

| 6,285,225 B1 | 9/2001 | Chu et al. |
| 7,821,309 B2 | 10/2010 | Lee |
| 7,872,510 B2 | 1/2011 | Lee |
| 7,940,095 B2 * | 5/2011 | Hur .......................... G11C 7/22 327/158 |

(Continued)

FOREIGN PATENT DOCUMENTS

KR    101630602 B1    6/2016

*Primary Examiner* — Ly D Pham
(74) *Attorney, Agent, or Firm* — Harness, Dickey & Pierce, P.L.C.

(57) ABSTRACT

A delay locked loop circuit includes a duty detector configured to detect a duty cycle of a clock signal, and to determine whether to perform a coarse duty cycle correction based on the detected duty, and a delay locked loop core. The delay locked loop core is configured to selectively perform the coarse duty cycle correction for the clock signal according to the determination of the duty detector, perform a coarse lock for the clock signal during a first time period different from a second time period in which the coarse duty cycle correction is performed, and perform a fine duty cycle correction and a fine lock for the clock signal.

20 Claims, 8 Drawing Sheets

(56) References Cited

U.S. PATENT DOCUMENTS

| | | | |
|---|---|---|---|
| 8,368,447 B1 | 2/2013 | Chou | |
| 8,803,577 B2 | 8/2014 | Park et al. | |
| 2004/0066873 A1* | 4/2004 | Cho | H03K 5/13 |
| | | | 375/376 |
| 2007/0188206 A1* | 8/2007 | Lee | H03L 7/07 |
| | | | 327/158 |
| 2007/0247203 A1* | 10/2007 | Cho | H03K 5/1565 |
| | | | 327/175 |
| 2008/0164920 A1* | 7/2008 | Cho | H03L 7/0812 |
| | | | 327/158 |
| 2010/0109725 A1* | 5/2010 | Yun | H03L 7/0814 |
| | | | 327/158 |
| 2010/0321076 A1* | 12/2010 | Bae | H03K 5/1565 |
| | | | 327/158 |
| 2011/0221495 A1* | 9/2011 | Lee | H03K 5/1565 |
| | | | 327/158 |
| 2011/0248756 A1 | 10/2011 | Abe | |
| 2013/0343134 A1* | 12/2013 | Willey | H03K 5/1565 |
| | | | 365/189.05 |
| 2015/0002201 A1* | 1/2015 | Kitagawa | H03K 5/1565 |
| | | | 327/175 |
| 2016/0156342 A1* | 6/2016 | Yun | H03K 7/08 |
| | | | 327/158 |
| 2016/0269014 A1* | 9/2016 | Lim | H03K 5/1565 |
| 2017/0117887 A1 | 4/2017 | Lee et al. | |
| 2017/0230040 A1* | 8/2017 | Jung | H03K 5/14 |

* cited by examiner

DELAY LOCKED LOOP CIRCUIT AND METHOD OF OPERATING A DELAY LOCKED LOOP CIRCUIT

CROSS-REFERENCE TO RELATED APPLICATIONS

This U.S. non-provisional application claims the benefit of priority under 35 U.S.C. § 119 to Korean Patent Application No. 10-2017-0168018 filed on Dec. 8, 2017 in the Korean Intellectual Property Office (KIPO), the entire contents of which are incorporated by reference herein.

BACKGROUND

Example embodiments of inventive concepts relate to semiconductor devices, and more particularly to delay locked loop circuits included in semiconductor devices and methods of operating the delay locked loop circuits.

Generally, a clock signal is widely used as a signal for synchronizing an operating timing of a semiconductor device. When a clock signal applied from an external device is used inside a semiconductor device, a time delay or a clock skew by internal circuits may occur. A delay locked loop (DLL) circuit may perform a function that synchronizes an internal clock signal with an external clock signal by compensating for this time delay. In particular, the DLL circuit is widely used in a synchronous memory device, such as a synchronous dynamic random access memory (SDRAM) that requires the synchronous operation for the clock signal. However, as an operating speed of a semiconductor device increases, a phenomenon where the clock signal is distorted such that a duty cycle (or a duty ratio) of the clock signal is not maintained as about 50% frequently occurs, which results in an abnormal operation of a double data rate (DDR) SDRAM using both rising and falling edges of the clock signal. Thus, the DLL circuit used in the DDR SDRAM should perform not only the locking for synchronizing the clock signal but also duty cycle correction (DCC). However, in a case where the DCC is performed along with the locking, the DCC may affect the locking, which may result in an operation error.

SUMMARY

Some example embodiments provide a delay locked loop circuit that accurately performs duty cycle correction and locking within a limited time.

Some example embodiments provide a method of operating a delay locked loop circuit that accurately performs duty cycle correction and locking within a limited time.

According to some example embodiments, a delay locked loop circuit includes a duty detector configured to detect a duty cycle of a clock signal, and to determine whether to perform a coarse duty cycle correction based on the detected duty, and a delay locked loop core. The delay locked loop core is configured to selectively perform the coarse duty cycle correction for the clock signal according to the determination of the duty detector, perform a coarse lock for the clock signal during a first time period different from a second time period in which the coarse duty cycle correction is performed, and perform a fine duty cycle correction and a fine lock for the clock signal.

According to some example embodiments, in a method of operating a delay locked loop circuit, the method comprises detecting a duty of a clock signal, determining whether to perform a coarse duty cycle correction based on the detected duty, selectively performing, at a first time period, the coarse duty cycle correction for the clock signal according to a result of the determination, performing a coarse lock for the clock signal during a second time period different from the first time period, and performing a fine duty cycle correction and a fine lock for the clock signal.

As described above, the delay locked loop circuit and the method of operating the delay locked loop circuit according to some example embodiments may perform a coarse duty cycle correction for a clock signal and a coarse lock for the clock signal in different time periods, which may more accurately perform the duty cycle correction and the locking with in a limited time.

Further, the delay locked loop circuit and the method of operating the delay locked loop circuit according to some example embodiments may selectively perform the coarse duty cycle correction based on the duty detected by the duty detector, which may reduce an operation time.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXAMPLE EMBODIMENTS

Figure 1:
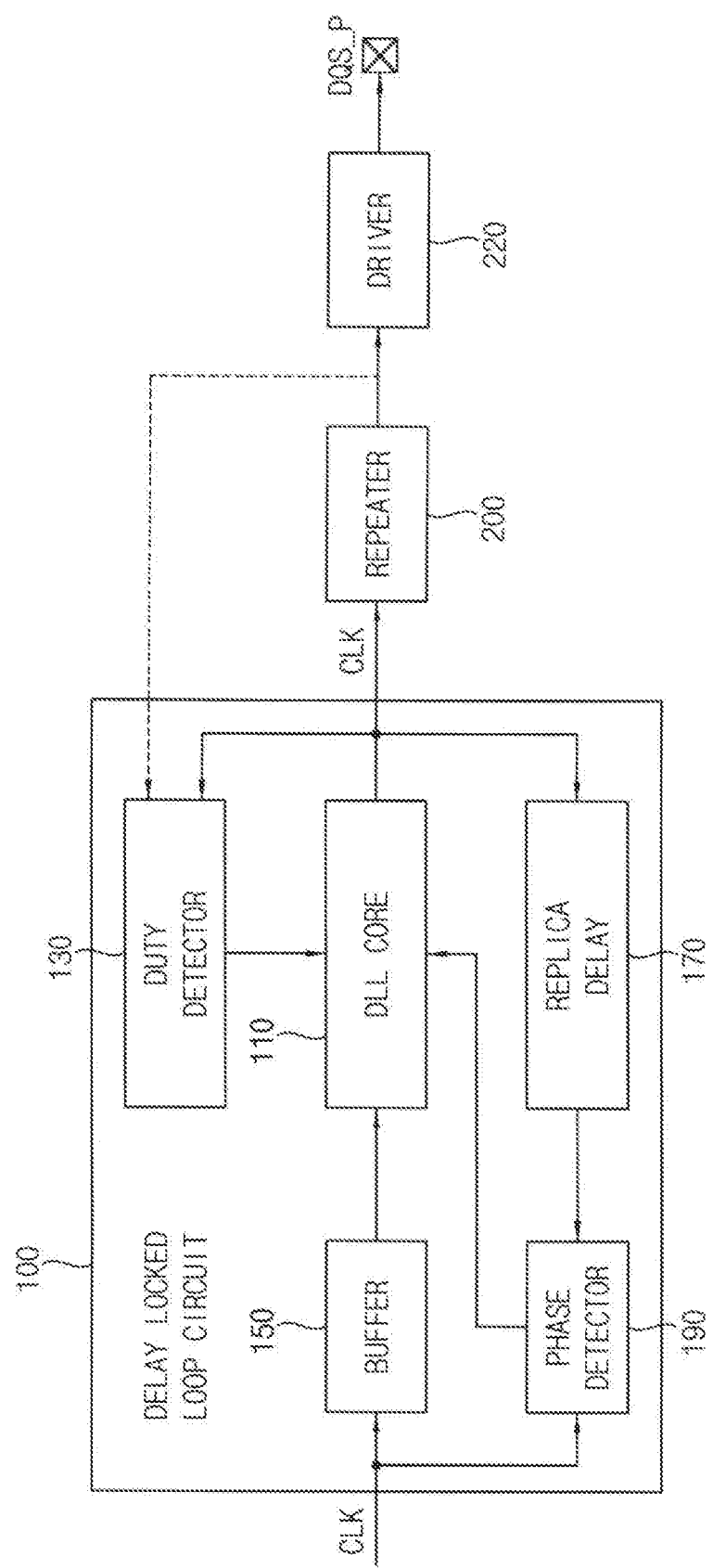
FIG. 1 is a block diagram illustrating a delay locked loop circuit according to some example embodiments.

FIG. 1 is a block diagram illustrating a delay locked loop circuit according to some example embodiments.

Referring to FIG. 1, a delay locked loop circuit 100 may include a duty detector 130 that detects a duty (e.g., a duty cycle or a duty ratio) of a clock signal CLK, and a delay locked loop core 110 that performs locking and/or a duty cycle correction (DCC). In some example embodiments, the delay locked loop circuit 100 may further include a buffer 150 that buffers the clock signal CLK received from an external circuit, a replica delay circuit 170 having a delay amount replicated from a delay amount of an external repeater 200, and a phase detector 190 that compares a phase of the clock signal CLK received from the external signal and a phase of the clock signal CLK output from the replica delay circuit 170.

The duty detector 130 may detect the duty of the clock signal CLK, and may provide the detected duty to the delay locked loop core 110 to perform the DCC. In some example embodiments, as illustrated in FIG. 1, the duty detector 130 may detect the duty of the clock signal CLK output from the delay locked loop core 110, but inventive concepts are not limited thereto. For example, as indicated by a dotted line in FIG. 1, the duty detector 130 may detect the duty of the clock signal CLK output from the external repeater 200.

The duty detector 130 may determine whether to perform a coarse DCC based on the detected duty. In some example embodiments, the duty detector 130 may determine that the coarse DCC does not need to be, or is not to be, performed when the detected duty is within a reference duty range, and may determine that the coarse DCC needs to be, or is to be, performed when the detected duty is outside the reference duty range.

The delay locked loop core 110 may selectively perform the coarse DCC for the clock signal CLK according to the determination of the duty detector 130, and may perform a coarse lock for the clock signal CLK during a time period different from a time period in which the coarse DCC is performed. In some example embodiments, the time period in which the coarse DCC is performed and the time period in which the coarse lock is performed may not overlap each other. For example, if the duty detector 130 determines that the coarse DCC is not to be performed, the delay locked loop core 110 may not perform the coarse DCC, and may perform the coarse lock. If the duty detector 130 determines that the coarse DCC is to be performed, the delay locked loop core 110 may perform the coarse DCC, and may perform the coarse lock after the coarse DCC is completed. Alternatively, the delay locked loop core 110 may perform the coarse lock, and may perform the coarse DCC after the coarse lock is completed.

In a conventional delay locked loop circuit that performs both of the locking and the DCC, the locking and the DCC are performed during the same time period. In this case, the locking may be affected by the DCC. In particular, a rising edge of a clock signal may be changed by the DCC when the DCC decreases a undesirably large duty (e.g., a duty greater than 50%), which may result in an abnormal operation in the locking performed based on the rising edge of the clock signal. However, in the delay locked loop circuit 100 according to some example embodiments, the coarse DCC and the coarse lock may be performed during different time periods, or during time periods that do not overlap each other, and thus abnormal operations of the locking and the DCC may be prevented, or reduced in likelihood of occurrence. Further, the delay locked loop circuit 100 according to some example embodiments may selectively perform the coarse DCC according to the determination of the duty detector 130, which may reduce an operation time (or a lock time) of the delay locked loop circuit 100.

The delay locked loop core 110 may further perform a fine DCC and a fine lock for the clock signal CLK. In some example embodiments, the delay locked loop core 110 may perform the fine DCC and the fine lock after the coarse lock is completed. For example, the delay locked loop core 110 may selectively perform the coarse DCC, may perform the coarse lock after the coarse DCC is completed (if the duty detector 130 determines that the coarse DCC is to be performed), and may perform the fine DCC and the fine lock after the coarse lock is completed.

In some example embodiments, the delay locked loop core 110 may perform the fine DCC and the fine lock during the same time period. For example, the delay locked loop core 110 may simultaneously perform the fine DCC and the fine lock after the coarse lock is completed, which may reduce the lock time. In other example embodiments, the delay locked loop core 110 may perform the fine DCC and the fine lock during different time periods. In an example, the delay locked loop core 110 may perform the fine DCC after the coarse lock is completed, and may perform the fine lock after the fine DCC is completed. In another example, the delay locked loop core 110 may perform the fine lock after the coarse lock is completed, and may perform the fine DCC after the fine lock is completed. In an example, the delay locked loop core 110 may selectively perform the coarse DCC, may perform the fine DCC after the coarse DCC is completed (if the duty detector 130 determines that the coarse DCC is to be performed), may perform the coarse lock after the fine DCC is completed, and may perform the fine lock after the coarse lock is completed. Further, the delay locked loop core 110 may perform the coarse DCC, the coarse lock, the fine DCC and the fine lock in various orders other than examples described above while satisfying conditions that the coarse DCC and the coarse lock are performed during different time periods, the fine DCC is performed after the coarse DCC, and the fine lock is performed after the coarse lock. For example, the delay locked loop core 110 may selectively perform the coarse DCC, may simultaneously perform the coarse lock and the fine DCC after the coarse DCC is completed, and then may perform the fine lock.

The buffer 150 may receive the clock signal CLK from the external circuit, and may buffer the received clock signal CLK to provide the buffered clock signal to the delay locked loop core 110. In some example embodiments, the delay locked loop circuit 100 may be included in a synchronous memory device, such as a synchronous dynamic random access memory (SDRAM), and the buffer 150 may receive the clock signal CLK from a memory controller as the external circuit through a clock pin of the memory device. The buffer 150 may change a voltage level of the clock signal CLK to a voltage level required or used by the memory device by buffering the clock signal CLK received through the clock pin.

Further, in a case where the delay locked loop circuit 100 is included in the memory device, the delay locked loop core 110 may output the clock signal CLK to the external repeater 200, and the replica delay circuit 170 may have a delay amount replicated from a delay amount of the external repeater 200. The clock signal CLK output from the external repeater 200 may be provided to a driver 220, and the driver 220 may output a data strobe signal through a data strobe pin DQS_P based on the clock signal CLK output from the external repeater 200. In some example embodiments, the replica delay circuit 170 may have a delay amount replicated from a sum of the delay amount of the external repeater 200 and a delay amount of the driver 220. The clock signal CLK output from the delay locked loop core 110 may be used not only in outputting the data strobe signal as illustrated in FIG. 1 but also in outputting data read from the memory device. Thus, to provide the clock signal CLK not only to the one or more drivers 220 outputting the data strobe signal but also to a plurality of drivers outputting the read data, the external repeater 200 may be, but is not limited to, a clock tree having a tree structure.

The replica delay circuit 170 may receive, as a feedback clock signal, the clock signal CLK output from the delay locked loop core 110, and may delay the feedback clock signal by a delay amount replicated from the delay amount of the external repeater and/or the delay amount of the driver 220. The phase detector 190 may receive the clock signal CLK from the external circuit (e.g., the memory controller), may receive the feedback clock signal from the replica delay circuit 170, and may compare a phase of the clock signal CLK received from the external circuit and a phase of the feedback clock signal received from the replica delay circuit 170. The phase detector 190 may generate an error signal corresponding to a phase difference between the clock signal CLK and the feedback clock signal, and may provide the error signal to the delay locked loop core 110 to perform the coarse lock and/or the fine lock. In some example embodiments, the phase detector 190 may include, but not limited to, a coarse phase detector that generates a coarse error signal used in the coarse lock performed by the delay locked loop core 110, and a fine phase detector that generates a fine error signal used in the fine lock performed by the delay locked loop core 110.

As described above, the delay locked loop circuit 100 according to some example embodiments may perform the coarse DCC for the clock signal CLK and the coarse lock for the clock signal CLK during different time periods, which may prevent or reduce the likelihood of the locking from being affected by the DCC and preventing or reducing the likelihood of abnormal operations of the locking and the DCC. Further, the delay locked loop circuit 100 according to some example embodiments may selectively perform the coarse DCC according to the determination of the duty detector 130, which may reduce the operation time (or the lock time) of the delay locked loop circuit 100.

Figure 2:
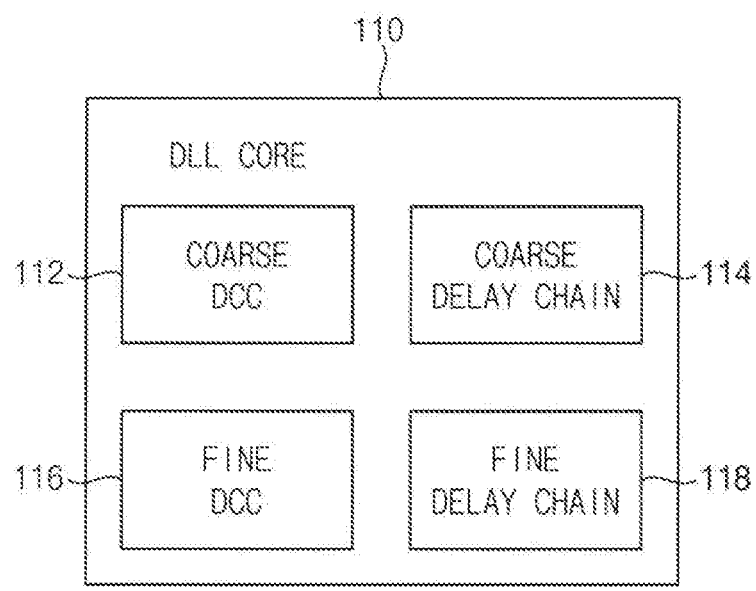
FIG. 2 is a block diagram illustrating an example of a delay locked loop core included in a delay locked loop circuit according to some example embodiments.

FIG. 2 is a block diagram illustrating an example of a delay locked loop core included in a delay locked loop circuit according to some example embodiments.

Referring to FIG. 2, a delay locked loop core 110 may include a coarse DCC circuit 112, a coarse delay chain 114, a fine DCC circuit 116 and a fine delay chain 118.

The coarse DCC circuit 112 may selectively perform a coarse DCC for a clock signal. For example, the coarse DCC circuit 112 may not perform the coarse DCC when a duty detector determines that a duty of the clock signal is within a reference duty range, and may perform the coarse DCC when the duty detector determines that the duty of the clock signal is outside the reference duty range. The fine DCC circuit 116 may perform a fine DCC for the clock signal. The coarse DCC circuit 112 may relatively coarsely adjust the duty of the clock signal, and the fine DCC circuit 116 may relatively finely adjust the duty of the clock signal, e.g. more finely than the coarse DCC circuit 112.

The coarse delay chain 114 may perform a coarse lock that relatively coarsely adjusts a phase of the clock signal based on a signal provided from a phase detector representing a phase difference between an input clock signal (or the clock signal received from an external circuit) and a feedback clock signal, and the fine delay chain 118 may perform a fine lock that relatively finely adjusts the phase of the clock signal based on the signal representing the phase difference between the input clock signal and the feedback clock signal. In some example embodiments, each of the coarse delay chain 114 and the fine delay chain 118 may include a plurality of delay units, each delay unit included in the coarse delay chain 114 may have a relatively great delay amount to relatively coarsely adjust the phase of the clock signal, and each delay unit included in the fine delay chain 118 may have a relatively less delay amount to relatively finely adjust the phase of the clock signal.

The coarse delay chain 114 may perform the coarse lock for the clock signal during a time period different from a time period in which the coarse DCC is performed by the coarse DCC circuit 112, which may prevent or reduce the likelihood of the locking from being affected by the DCC and preventing or reducing the likelihood of abnormal operations of the locking and the DCC. The coarse DCC, the coarse lock, the fine DCC and the fine lock may be performed in various orders while satisfying conditions that the coarse DCC and the coarse lock are performed during different time periods, the fine DCC is performed after the coarse DCC, and the fine lock is performed after the coarse lock.

Figure 3:
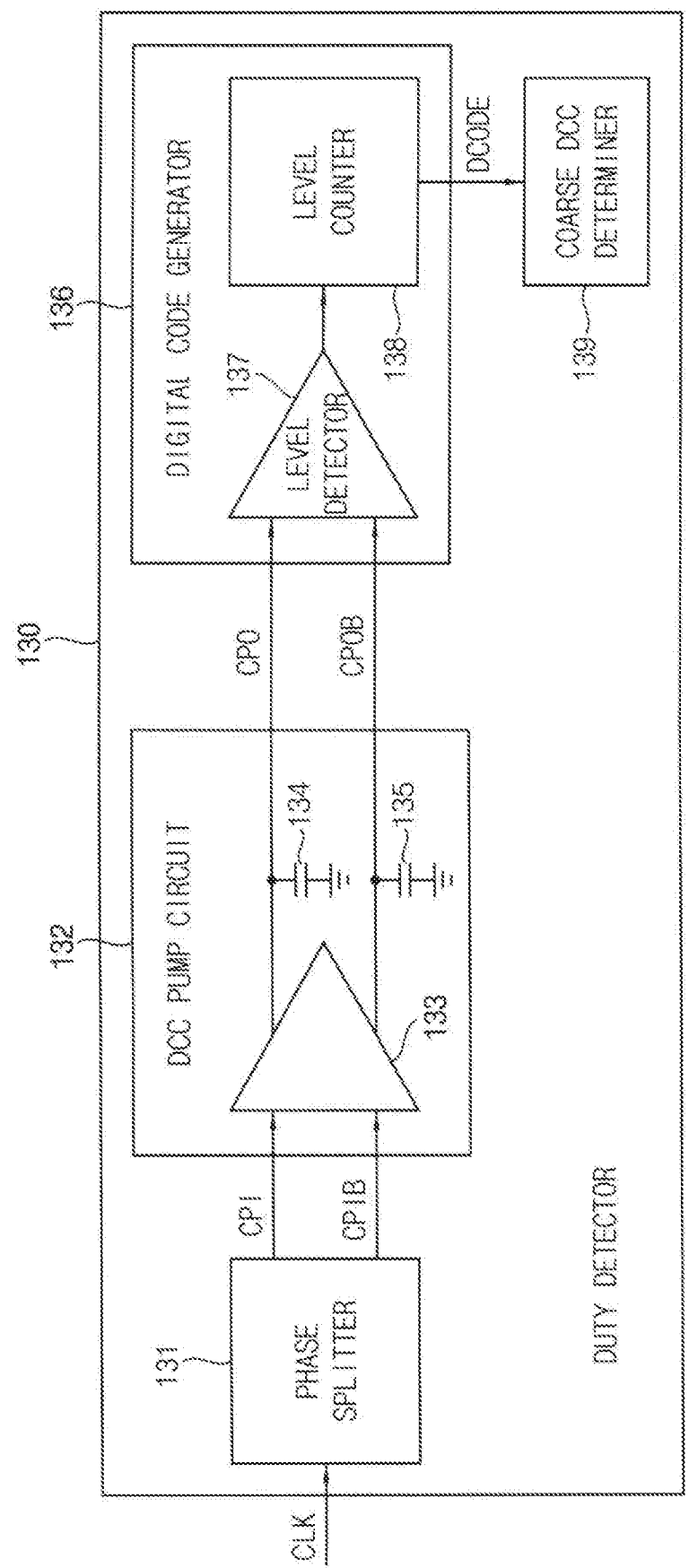
FIG. 3 is a block diagram illustrating an example of a duty detector included in a delay locked loop circuit according to some example embodiments.
Figure 4:
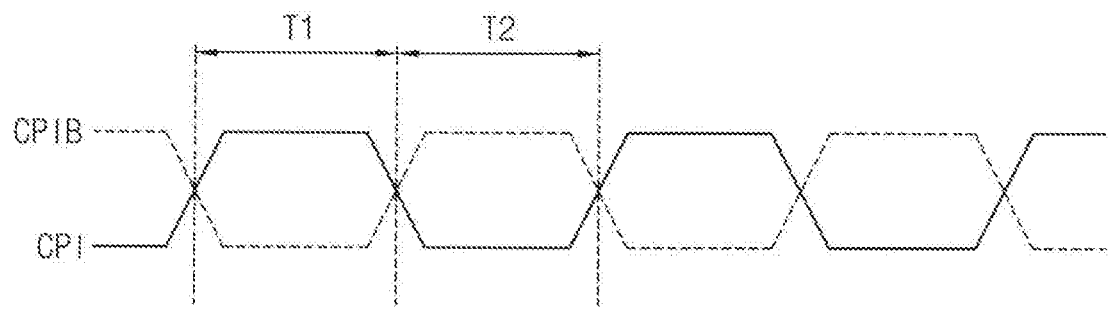
FIG. 4 is a timing diagram for describing an example of an operation of a duty cycle correction pump circuit illustrated in FIG. 3.
Figure 5:
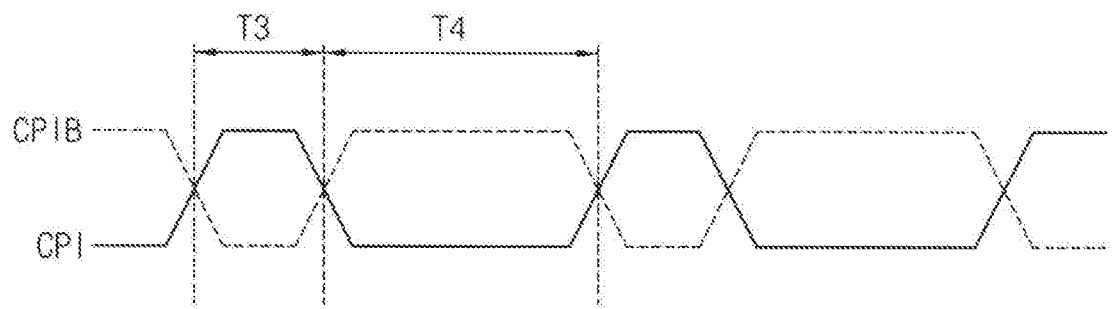
FIG. 5 is a timing diagram for describing another example of an operation of a duty cycle correction pump circuit illustrated in FIG. 3.
Figure 6:
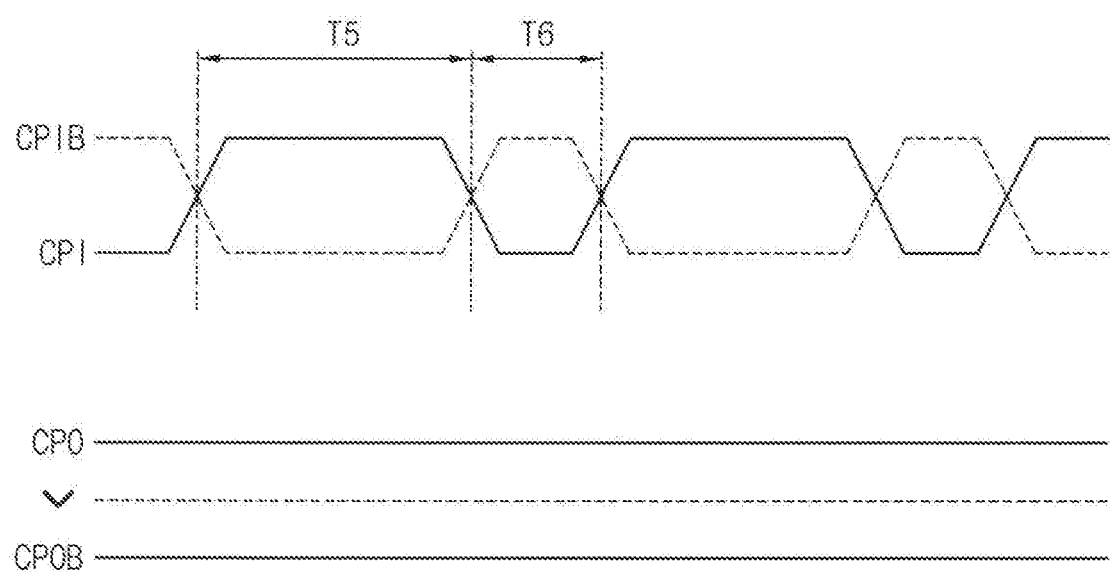
FIG. 6 is a timing diagram for describing still another example of an operation of a duty cycle correction pump circuit illustrated in FIG. 3.

FIG. 3 is a block diagram illustrating an example of a duty detector included in a delay locked loop circuit according to some example embodiments, FIG. 4 is a timing diagram for describing an example of an operation of a duty cycle correction pump circuit illustrated in FIG. 3, FIG. 5 is a timing diagram for describing another example of an operation of a duty cycle correction pump circuit illustrated in FIG. 3, and FIG. 6 is a timing diagram for describing still another example of an operation of a duty cycle correction pump circuit illustrated in FIG. 3.

Referring to FIG. 3, a duty detector 130 may include a phase splitter 131, a DCC pump circuit 132, a digital code generator 136 and a coarse DCC determiner 139.

The phase splitter 131 may generate a first pump input signal CPI having a phase the same as a phase of a clock signal CLK, and a second pump input signal CPIB having a phase that is inverted from the phase of the clock signal CLK based on the clock signal CLK. In some example embodiments, as illustrated in FIG. 1, the phase splitter 131 may receive the clock signal CLK output from a delay locked loop core 110. In some example embodiments, the phase splitter 131 may receive the clock signal CLK output from an external repeater 200 illustrated in FIG. 1, but inventive concepts are not limited thereto. The phase splitter 131 may output, as the first pump input signal CPI, the clock signal CLK as it is, and may output the second pump input signal CPIB by inverting the clock signal CLK or by delaying the phase of the clock signal CLK by about 180 degrees. Thus, the first pump input signal CPI and the second pump input signal CPIB may have inverted phases, or phases delayed by 180 degrees.

The DCC pump circuit 132 may generate a first pump voltage CPO having a voltage level corresponding to a duty of the first pump input signal CPI and a second pump voltage CPOB having a voltage level corresponding to a duty of the second pump input signal CPIB. The DCC pump circuit 132 may provide the first pump voltage CPO and/or the second pump voltage CPOB to the delay locked loop core 110 to perform a coarse DCC and/or a fine DCC. In some example embodiments, the DCC pump circuit 132 may include a first capacitor 134 that outputs the first pump voltage CPO, a second capacitor 135 that outputs the second pump voltage CPOB, and a charge pump 133 that charges the first capacitor 134 during a high period of the first pump input signal CPI and charges the second capacitor 135 during a high period of the second pump input signal CPIB.

For example, as illustrated in FIG. 4, in a case where the clock signal CLK has a duty of about 50%, the first pump input signal CPI and the second pump input signal CPIB also may have the duty of about 50%, and the high period T1 of the first pump input signal CPI and the high period T2 of the second pump input signal CPIB may have the same length. Accordingly, a voltage of the first capacitor 134 charged by the charge pump 133 during the high period T1 of the first pump input signal CPI, or the first pump voltage CPO, and a voltage of the second capacitor 135 charged by the charge pump 133 during the high period T2 of the second pump input signal CPIB, or the second pump voltage CPOB may have substantially the same voltage level.

In another example, as illustrated in FIG. 5, in a case where the clock signal CLK has a duty less than about 50%, the duty of the first pump input signal CPI may be less than about 50%, the duty of the second pump input signal CPIB may be greater than about 50%, and the high period T3 of the first pump input signal CPI may be shorter than the high period T4 of the second pump input signal CPIB. Accordingly, the voltage of the first capacitor 134 charged by the charge pump 133 during the high period T3 of the first pump input signal CPI, or the first pump voltage CPO may have a voltage level lower than that of the voltage of the second capacitor 135 charged by the charge pump 133 during the high period T4 of the second pump input signal CPIB, or the second pump voltage CPOB.

In another example, as illustrated in FIG. 6, in a case where the clock signal CLK has a duty greater than about 50%, the duty of the first pump input signal CPI may be greater than about 50%, the duty of the second pump input signal CPIB may be less than about 50%, and the high period T5 of the first pump input signal CPI may be longer than the high period T6 of the second pump input signal CPIB. Accordingly, the voltage of the first capacitor 134 charged by the charge pump 133 during the high period T5 of the first pump input signal CPI, or the first pump voltage CPO may have a voltage level higher than that of the voltage of the second capacitor 135 charged by the charge pump 133 during the high period T6 of the second pump input signal CPIB, or the second pump voltage CPOB.

The digital code generator 136 may generate a digital code DCODE corresponding to a voltage level difference between the first pump voltage CPO and the second pump voltage CPOB. In some example embodiments, the digital code generator 136 may include a level detector 137 that generates a comparison result signal by comparing the voltage level of the first pump voltage CPO and the voltage level of the second pump voltage CPOB, and a level counter that generates the digital code DCODE by counting the comparison result signal. The digital code DCODE generated by the digital code generator 136 may be provided to the coarse DCC determiner 139.

The coarse DCC determiner 139 may determine whether the coarse DCC is to be performed by the delay locked loop core 110 based on the digital code DCODE. In some example embodiments, the coarse DCC determiner 139 may store a reference digital code range corresponding to a reference duty range for the clock signal CLK, may determine whether the digital code DCODE is within the reference digital code range, may determine that the coarse DCC does not need to be or is not to be performed when the digital code DCODE is within the reference digital code range, and may determine that the coarse DCC needs to be or is to be performed when the digital code DCODE is outside the reference digital code range. The coarse DCC determiner 139 may provide a result of the determination to the delay locked loop core 110 which may allow the delay locked loop core 110 to selectively perform the coarse DCC according to the result of the determination.

Figure 7:
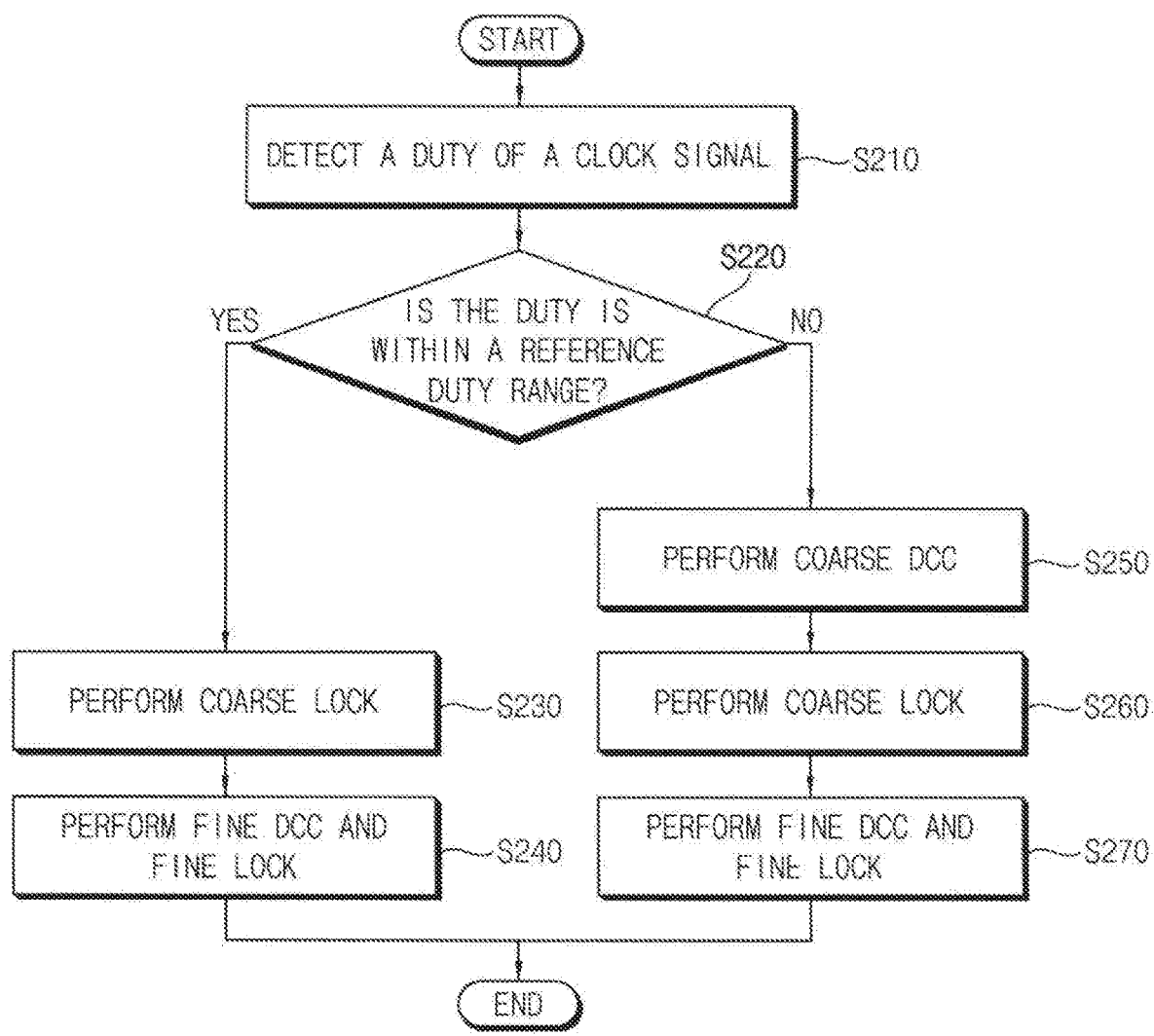
FIG. 7 is a flowchart illustrating a method of operating a delay locked loop circuit according to some example embodiments.
Figure 8:
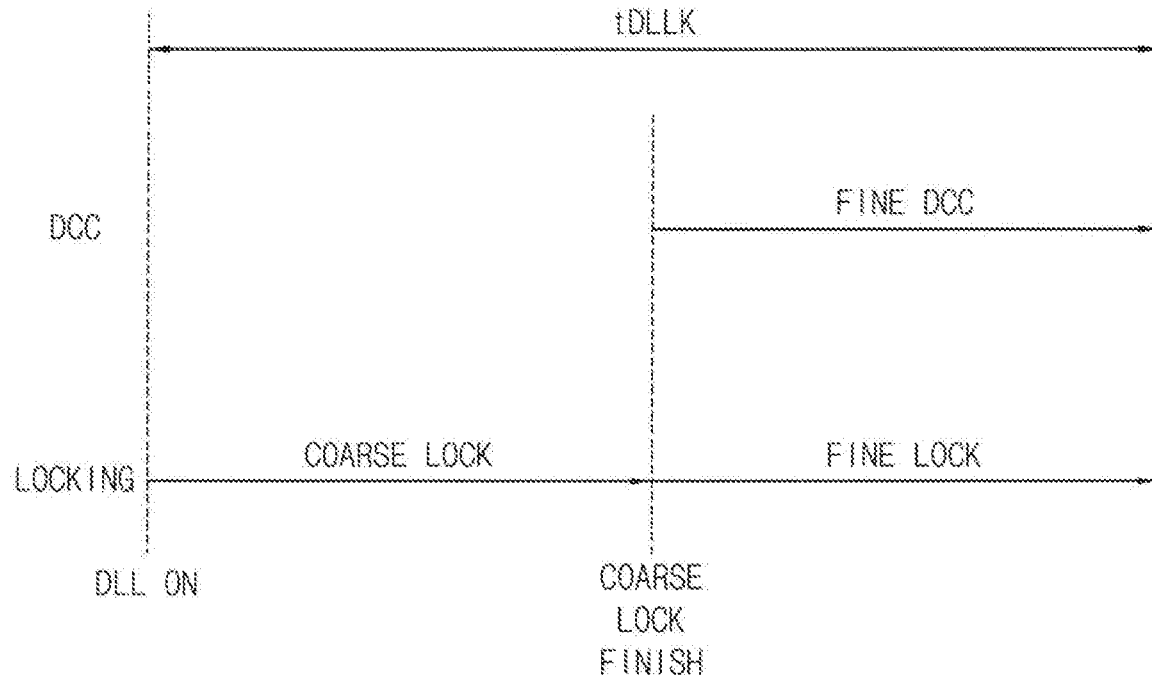
FIG. 8 is a diagram for describing an example of an operation of a delay locked loop circuit according to some example embodiments.
Figure 9:
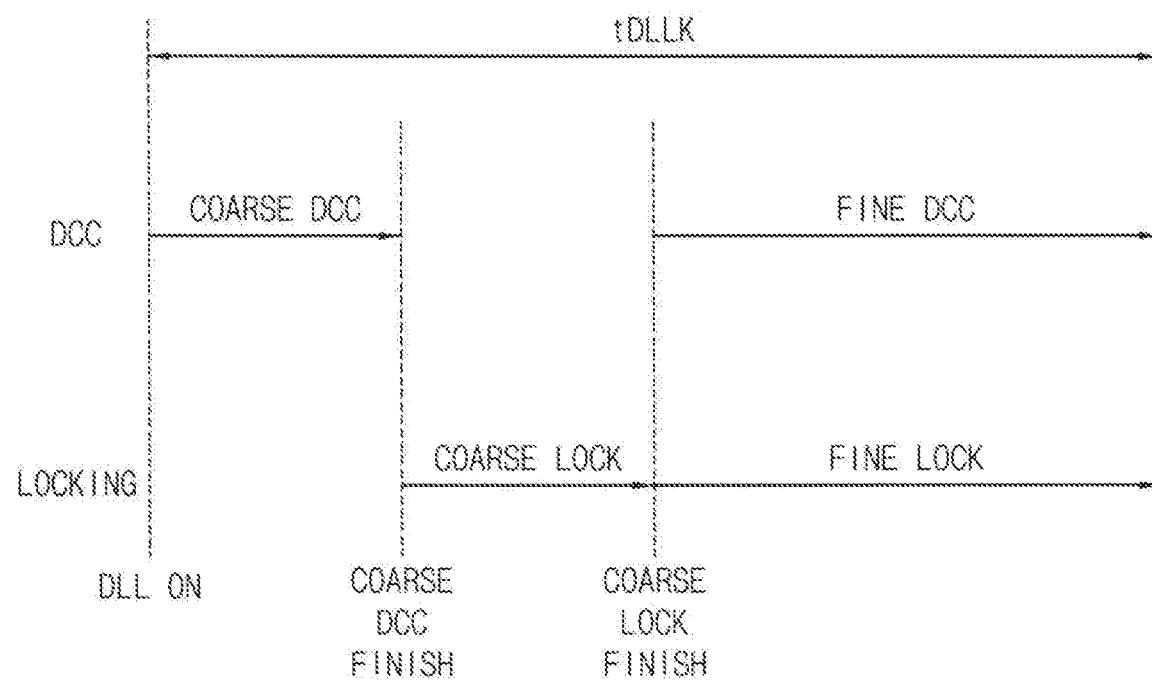
FIG. 9 is a diagram for describing another example of an operation of a delay locked loop circuit according to some example embodiments.

FIG. 7 is a flowchart illustrating a method of operating a delay locked loop circuit according to some example embodiments, FIG. 8 is a diagram for describing an example of an operation of a delay locked loop circuit according to some example embodiments, and FIG. 9 is a diagram for describing another example of an operation of a delay locked loop circuit according to some example embodiments.

Referring to FIG. 7, a delay locked loop circuit according to some example embodiments may detect a duty of a clock signal (S210), and may determine whether the detected duty is within a reference duty range (S220). The delay locked loop circuit may determine that a coarse DCC does not need to be or is not to be performed if the detected duty is within the reference duty range (S220: YES), and may determine that the coarse DCC needs to be or is to be performed if the detected duty is outside the reference duty range (S220: NO).

If the detected duty is within the reference duty range (S220: YES), the delay locked loop circuit may perform a coarse lock without performing the coarse DCC (S230), and may perform a fine DCC and a fine lock (S240). For example, as illustrated in FIG. 8, when the delay locked loop circuit is powered on (DLL ON) or reset, the delay locked loop circuit may perform the coarse lock. In some example embodiments, an execution time of the coarse lock may be previously stored, and the delay locked loop circuit may terminate the coarse lock if the previously stored execution time elapses. In some example embodiments, the delay locked loop circuit may terminate the coarse lock according to a determination result by a coarse phase detector included in a phase detector, but a termination (or completion) time point may not be limited thereto. Once the coarse lock is terminated, e.g. completed or finished, the delay locked loop circuit may simultaneously perform the fine DCC and the fine lock. In some example embodiments, the delay locked loop circuit may be included in a memory device, and the delay locked loop circuit may perform locking and DCC within a limited time, or a delay locked loop locking time tDLLK defined in a standard of the memory device. In the method of operating the delay locked loop circuit according to some example embodiments, since the coarse DCC is selectively performed, the locking and the DCC may be more efficiently performed within the limited time.

If the detected duty is outside the reference duty range (S220: NO), the delay locked loop circuit may perform the coarse DCC (S250), may perform the coarse lock during a time period different from a time period in which the coarse DCC is performed (S260), and may perform the fine DCC and the fine lock (S270). For example, as illustrated in FIG. 9, once the delay locked loop circuit is powered on (DLL ON) or reset, the delay locked loop circuit may perform the coarse DCC. In some example embodiments, an execution time of the coarse DCC may be previously stored, and the delay locked loop circuit may terminate the coarse DCC if the previously stored execution time elapses. However, a termination (or completion) time point of the coarse DCC may not be limited thereto. Once the coarse DCC is terminated, e.g. completed or finished, the delay locked loop circuit may perform the coarse lock. As described above, in the method of operating the delay locked loop circuit according to some example embodiments, the coarse DCC and the coarse lock may be performed during different time periods, or during time periods that do not overlap, which may prevent or reduce the likelihood of the locking from being affected by the DCC and preventing abnormal operations of the locking and the DCC. Once the coarse lock is terminated, e.g. completed or finished, the delay locked loop circuit may simultaneously perform the fine DCC and the fine lock.

Although FIG. 8 illustrates an example where the fine DCC and the fine lock are performed after the coarse lock is completed, and FIG. 9 illustrates an example where the coarse lock is performed after the coarse DCC is completed, and the fine DCC and the fine lock are performed after the coarse lock is completed, in some example embodiments, the coarse DCC, the coarse lock, the fine DCC and the fine lock may be performed in various orders while satisfying conditions that the coarse DCC and the coarse lock are performed during different time periods, the fine DCC is performed after the coarse DCC, and the fine lock is performed after the coarse lock.

Figure 10:
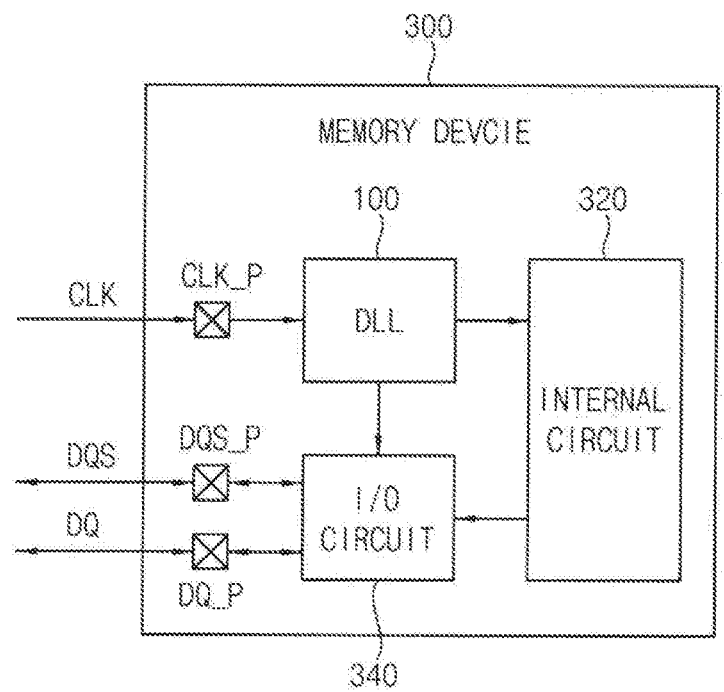
FIG. 10 is a block diagram illustrating a memory device including a delay locked loop circuit according to some example embodiments.

FIG. 10 is a block diagram illustrating a memory device including a delay locked loop circuit according to some example embodiments.

Referring to FIG. 10, a memory device 300 may include a delay locked loop circuit 100, an internal circuit 320 and an input/output (I/O) circuit 340.

The delay locked loop circuit 100 may receive a clock signal CLK from a memory controller through a clock pin CLK_P, may selectively perform a coarse DCC for the clock signal CLK, may perform a coarse lock for the clock signal CLK during a time period different from a time period in which the coarse DCC is performed, and may perform a fine DCC and a fine lock for the clock signal CLK. Accordingly, the delay locked loop circuit 100 may more accurately perform locking and DCC within a limited time (e.g., tDLLK). The delay locked loop circuit 100 may provide the clock signal CLK on which the locking and the DCC are performed to the internal circuit 320 and the I/O circuit 340.

When a data write operation is performed, the I/O circuit 340 may receive a data strobe signal DQS from the memory controller through a data strobe pin DQS_P, and may receive data DQ from the memory controller through a data pin DQ_P. When a data read operation is performed, the I/O circuit 340 may output the data strobe signal DQS to the memory controller through the data strobe pin DQS_P, and may output the data DQ to the memory controller through the data pin DQ_P. The I/O circuit 340 may output the data strobe signal DQS and the data DQ based on the clock signal CLK provided from the delay locked loop circuit 100.

Figure 11:
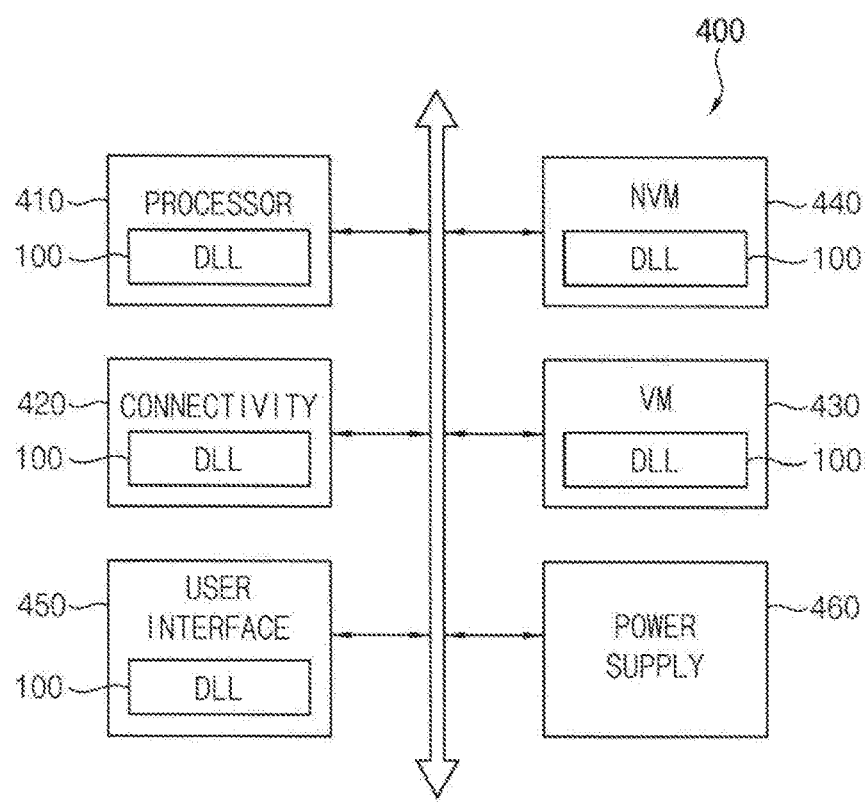
FIG. 11 is a block diagram illustrating a computing system including a delay locked loop circuit according to some example embodiments.

FIG. 11 is a block diagram illustrating a computing system including a delay locked loop circuit according to some example embodiments.

Referring to FIG. 11, a computing system 400 may include a processor 410, connectivity 420, a volatile memory device 430, a nonvolatile memory device 440, a user interface 450 and a power supply 460. In some example embodiments, the computing system 400 may be any electronic device, such as a personal computer (PC), a laptop computer, a server computer, a workstation, a cellular phone, a smart phone, a tablet computer, an MP3 player, personal digital assistants (PDA), a portable multimedia player (PMP), a digital television (TV), a digital camera, a portable game console, etc.

The processor 410 may control overall operations of the computing system 400. In some example embodiments, the processor 410 may be a central processing unit (CPU), a microprocessor, an application processor (AP), or the like. The connectivity 420 may perform wired and/or wireless communications with an external device. The volatile memory device 430 may store data processed by the processor 410, or may operate as a working memory. For example, the volatile memory device 430 may be implemented with, but not limited to, a static random access memory (SRAM) device, a dynamic random access memory (DRAM) device, a mobile DRAM, a DDR SDRAM, an LPDDR SDRAM, a GDDR SDRAM, an RDRAM, and/or the like. The nonvolatile memory device 440 may store a boot image for booting the computing system 400. For example, the nonvolatile memory device 440 may be implemented with, but not limited to, a flash memory device, a phase-change random access memory (PRAM), a magnetic random access memory (MRAM), a resistive random access memory (RRAM), a ferroelectric random access memory (FRAM), and/or the like. The user interface 450 may include at least one input device, such as a keypad, a touch screen, etc., and/or at least one output device, such as a speaker, a display device, etc. The power supply 460 may supply an operating voltage of the computing system 400. The computing system 400 may further include a camera image processor (CIS), and may further include a storage device, such as a memory card, a solid state drive (SSD), a hard disk drive (HDD), a CD-ROM, etc.

The processor 410, the connectivity 420, the volatile memory device 430 and the nonvolatile memory device 440 may include a delay locked loop circuit 100 according to some example embodiments. The delay locked loop circuit 100 may perform a coarse DCC for a clock signal and a coarse lock for the clock signal in different time periods, thereby accurately performing DCC and locking within a limited time. Further, the delay locked loop circuit 100 may selectively perform the coarse DCC based on a duty detected by a duty detector, thereby reducing an operation time or a lock time.

Inventive concepts may be applied to any delay locked loop circuit and any semiconductor device including the delay locked loop circuit. For example, inventive concepts may be applied to a memory device, such as a DDR SDRAM, including the delay locked loop circuit.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A delay locked loop circuit comprising:
a duty detector configured to detect a duty cycle of a clock signal, and to determine whether to perform a coarse duty cycle correction based on the detected duty; and
a delay locked loop core configured to,
selectively perform the coarse duty cycle correction for the clock signal according to the determination of the duty detector,
perform a coarse lock for the clock signal during a first time period different from a second time period in which the coarse duty cycle correction is performed, and perform a fine duty cycle correction and a fine lock for the clock signal.

2. The delay locked loop circuit of claim 1, wherein the first time period and the second time period do not overlap each other.

3. The delay locked loop circuit of claim 1, wherein the delay locked loop core is configured to perform fine duty cycle correction and the fine lock after completing the coarse lock.

4. The delay locked loop circuit of claim 1, wherein the delay locked loop core is configured to perform the fine duty cycle correction and the fine lock during a same time period.

5. The delay locked loop circuit of claim 1, wherein the delay locked loop core is configured to perform the fine duty cycle correction and the fine lock during different time periods.

6. The delay locked loop circuit of claim 1, wherein the duty detector is configured to,
   determine that the coarse duty cycle correction is not to be performed when the detected duty is within a reference duty range, and
   determine that the coarse duty cycle correction is to be performed when the detected duty is outside the reference duty range.

7. The delay locked loop circuit of claim 1, wherein the duty detector includes:
   a phase splitter configured to generate, based on the clock signal, a first pump input signal having a same phase as the clock signal and a second pump input signal having an inverted phase from the clock signal;
   a duty cycle correction pump circuit configured to generate a first pump voltage having a voltage level corresponding to a duty ratio of the first pump input signal and a second pump voltage having a voltage level corresponding to a duty ratio of the second pump input signal;
   a digital code generator configured to generate a digital code corresponding to a voltage level difference between the first pump voltage and the second pump voltage; and
   a coarse duty cycle correction determiner configured to determine whether to perform the coarse duty cycle correction based on the digital code.

8. The delay locked loop circuit of claim 7, wherein the duty cycle correction pump circuit includes:
   a first capacitor configured to output the first pump voltage;
   a second capacitor configured to output the second pump voltage; and
   a charge pump configured to charge the first capacitor during a high period of the first pump input signal, and to charge the second capacitor during a high period of the second pump input signal.

9. The delay locked loop circuit of claim 7, wherein the digital code generator includes:
   a level detector configured to generate a comparison result signal by comparing the voltage level of the first pump voltage and the voltage level of the second pump voltage; and
   a level counter configured to generate the digital code by counting the comparison result signal.

10. The delay locked loop circuit of claim 7, wherein the coarse duty cycle correction determiner is configured to,
    store a reference digital code range corresponding to a reference duty range for the clock signal,
    determines that the coarse duty cycle correction is not to be performed when the digital code is within the reference digital code range, and
    determine that the coarse duty cycle correction is to be performed when the digital code is outside the reference digital code range.

11. The delay locked loop circuit of claim 1, wherein the delay locked loop core includes:
    a coarse duty cycle correction circuit configured to selectively perform the coarse duty cycle correction for the clock signal according to the determination of the duty detector;
    a coarse delay chain configured to perform the coarse lock for the clock signal during the first time period;
    a fine duty cycle correction circuit configured to perform the fine duty cycle correction for the clock signal after the delay locked loop core completes the coarse duty cycle correction; and
    a fine delay chain configured to perform the fine lock for the clock signal after the delay locked loop core completes the coarse lock.

12. The delay locked loop circuit of claim 11, wherein a delay amount of each delay unit included in the coarse delay chain is greater than a delay amount of each delay unit included in the fine delay chain.

13. The delay locked loop circuit of claim 1, further comprising:
    a buffer configured to receive the clock signal from an external circuit, and to buffer the received clock signal to provide the buffered clock signal to the delay locked loop core.

14. The delay locked loop circuit of claim 1, wherein the delay locked loop core is configured to output the clock signal to an external repeater, and
    wherein the delay locked loop circuit further comprises:
    a replica delay circuit configured to receive a feedback clock signal from the delay locked loop core, and to delay the feedback clock signal by a delay amount replicated from a delay amount of the external repeater.

15. The delay locked loop circuit of claim 14, further comprising:
    a phase detector configured to receive the clock signal from an external circuit, to receive the feedback clock signal from the replica delay circuit, and to compare a phase of the clock signal received from the external circuit and a phase of the feedback clock signal received from the replica delay circuit.

16. A memory device comprising:
    the delay locked loop circuit of claim 1; and
    a clock pin configured to receive the clock signal.

17. A method of operating a delay locked loop circuit, the method comprising:
    detecting a duty of a clock signal;
    determining whether to perform a coarse duty cycle correction based on the detected duty;
    selectively performing, during a first time period, the coarse duty cycle correction for the clock signal according to a result of the determination;
    performing a coarse lock for the clock signal during a second time period different from the first time period; and
    performing a fine duty cycle correction and a fine lock for the clock signal.

18. The method of claim 17, wherein the first time period and the second time period do not overlap each other.

19. The method of claim 17, wherein the fine duty cycle correction and the fine lock are performed after completion of the coarse lock.

20. The method of claim 17, wherein the fine duty cycle correction and the fine lock are performed during a same time period.

* * * * *